United States Patent [19]

Olds

[11] Patent Number: 4,980,195

[45] Date of Patent: Dec. 25, 1990

[54] METHOD FOR INHIBITING INLAND CORROSION OF STEEL

[75] Inventor: Robert Olds, St. Louis, Mo.

[73] Assignee: McDonnen-Douglas Corporation, St. Louis, Mo.

[21] Appl. No.: 348,948

[22] Filed: May 8, 1989

[51] Int. Cl.$^5$ .......................... B05D 1/36; B05D 1/18; B05D 3/06
[52] U.S. Cl. ...................................... 427/38; 427/367; 427/404; 427/405; 427/435; 427/436; 204/192.31
[58] Field of Search ................. 427/38, 367, 404, 405, 427/435, 436; 204/192.31; 420/540

[56] References Cited

U.S. PATENT DOCUMENTS

| | | | |
|---|---|---|---|
| 3,974,055 | 8/1976 | Reding et al. | 420/540 |
| 4,238,233 | 12/1980 | Yamada et al. | 420/541 |
| 4,740,355 | 4/1988 | Linder et al. | 420/540 |
| 4,788,078 | 11/1988 | Broomfield et al. | 427/38 |

FOREIGN PATENT DOCUMENTS 3305612  8/1984  Fed. Rep. of Germany ...... 420/540

*Primary Examiner*—Shrive Beck
*Assistant Examiner*—Margaret Bueker
*Attorney, Agent, or Firm*—Veo Peoples, Jr.

[57] ABSTRACT

An improved method for inhibiting inland atmospheric corrosion of steel by a sacrificial coating of aluminum, galvanically activated by small surface deposits of metallic indium is disclosed.

9 Claims, No Drawings

METHOD FOR INHIBITING INLAND CORROSION OF STEEL

BACKGROUND OF THE INVENTION

The present invention relates to new and improved methods for inhibiting inland atmospheric corrosion of steel, and particularly to improved sacrificial coatings for steel substrates.

In the past, ion vapor deposited aluminum has been proposed as a sacrificial coating to protect steel substrates from corrosion damage. Through salt fog exposure test such pure aluminum coatings have been shown to provide good potential for sacrificial corrosion protection of offshore steel substrates. However, evidence has been adduced to indicate that such pure aluminum coatings do not sacrificially protect inland steel substrates because the aluminum tends to passivate.

Our co-pending application discloses a method for solving this problem by alloying aluminum with other metals, anodic to steel, such as zinc and indium in a co-deposition process. Although the codeposition of aluminum-zinc alloys has met with extreme success, co-deposition of aluminum-indium alloys leaves a great deal to be desired for commercial success.

The periodical entitled "Corrosion" at Volume 40, Number 7, July 1984, in the article "A Proposed Activation Mechanism For Aluminum Anodes" by the author's Reboul, Gimenez, and Rameau mentions that there is an exchange reaction between aqueous solutions of indium salts and aluminum to form metallic indium deposits on the surface of the aluminum. However, Reboul, et. al, believed that the indium had to be in solid solution in order to sufficiently activate the aluminum.

Many indium salts are unstable in aqueous solutions because of their tendancy to form insoluble compounds each as the hydroxide. Nevertheless, Indium is a highly desireable source for activating aluminum if a process could be developed to incorporate it into aluminum coatings more effectively from aqueous solution than by co-deposition, and achieve greater stability of an aqueous solution of certain of its salts.

Accordingly, a liquid solution activating process for aluminum coated steel substrates that would effectively permit sacrificial inland corrosion protection of steel in mild environments would be a surprising and unexpected advancement in the art, fulfilling a long felt need in the industry.

SUMMARY OF THE INVENTION

It is a principal object of the present invention to provide a new and improved method for inhibiting inland atmospheric corrosion of steel with a sacrificial aluminum coating activated by indium.

It is a further object of the present invention to provide an improved indium activated aluminum coating for steel substrates without the need for producing a solid solution.

It is also an object of the present invention to provide a new and improved method for activating aluminum coatings for steel substrates increasing the sacrificial corrosion protection mechanism with an aqueous indium salt solution which has been stabilized against premature precipitation of indium bases such as indium hydroxide.

These objects and others will become more apparent from the following detailed description, examples, and claims.

DETAILED DESCRIPTION AND PREFERRED EMBODIMENTS

In the process of the present invention pure aluminum feedstock is fed into conventional ion vapor deposition equipment. Such equipment is known for example from U. S. Pat. Nos. 3,750,623; 3,926,147; 4,116,161; and 4,233,937.

The pure aluminum is then ion vapor deposited onto steel substrates. The general parameters of such deposition process include, for example, aluminum wire feed rates between 3 and 40 inches per minute, depending upon desired deposition rate, wire diameter, chamber size, and total area to be coated; argon gas pressure between $5 \times 10$ and $5 \times 10$ torr; and an applied potential of between 1000 and 1800 volts between the parts to be coated and the evaporating boats. (The parts are at a negative potential with respect to the boats.)

The aluminum coated steel substrates are then glass bead burnished to densify and cold work the deposited coating under the following conditions and ranges of parameters: glass beads are used as the burnishing agent under an air pressure of 30 to 40 psig in a standard abrasive blasting cabinet.

In accordance with the present invention, it has been found that immersion of such aluminum coated and burnished parts in aqueous acid solutions of indium acid salt and holding the parts in such solutions will provide suprisingly, the requisite small surface deposits of metallic-indium needed for activation of the aluminum coating improving its inland sacrificial corrosion protection of steel.

These indium solutions are prepared by dissolving indium salts such as, for example indium trinitrate, indium (III) sulfate, or indium trichloride but preferably indium trichloride. It is critical in the process of the present invention to prepare such solutions at acid pH ranging from about 1.5, to about 3.0, but preferably about 2.0. The concentration of indium may be, for example, from about 0.08 to about 3.0, but preferably about 0.1 molar of the preferred embodiment indium trichloride. One effective means for assuring the preferred pH of about 2 is to adjust the pH, with for example, hydrochloric acid. This acidification must be carried out at the time the solution is initially mixed. Once indium bearing precipitates are formed, they are difficult or impossible re-dissolve by addition of acid. Another reason for acidifying the solution is to aid in dissolving the naturally formed aluminum oxide passive layer on the aluminum coating. The bare and active aluminum surface is necessary to initiate the indium deposition.

It has been discovered that it is also critical to the process of the present invention to hold or retain the aluminum coated steel substrate in the solution for a sufficient time. That time is preferably from about 2 to 30 seconds. Lesser time will not permit sufficient deposition of metallic indium while retention times which exceed 30 seconds will adversely affect the process because of excessive deposition of indium.

As previously stated, the effective amount of indium in the solution is provided within a molar amount of from 0.08 to about 0.25 molar. Lesser amounts are undesireable because of possible dissolution of excessive amounts of the aluminum coating, while greater amounts may be detrimental because of deposition of excessively large and unevenly distributed indium particles, or hydralyzed by-products.

After holding the aluminum coated steel substrate in the solution for the requisite amount of time the steel is then removed from solution, rinsed by any convenient means such as water but preferably by distilled water followed by a methanol rinse and subsequently drying.

Surprisingly, the treated steel substrates exhibit activation of the aluminum and thus sacrificial corrosion protection to the steel even in inland environments without the need for a solid solution. Also surprising, is the fact that the indium is stabilized against premature precipitation in a basic form, such as indium hydroxide which would ordinarily be expected to precipitate because of hydrolysis reaction with water. The usual pH of an 0.1 molar solution of indium trichloride is approximately 3.8 at room temperature. Apparently, this pH is not sufficiently low to prevent hydrolysis and the resulting precipitation of indium hydroxide.

The examples which follow are intended for illustrative purposes and therefore, should not be construed as unduly limiting the scope of the present invention.

EXAMPLE 1

Four identical steel parts of the type normally used for atmospheric corrosion test specimens were ion vapor deposited with pure aluminum under the following conditions: At an argon plasma pressure of approximately $10^{-4}$ torr and an impressed potential difference of 1200 volts between the specimens to be coated (negative) and the evaporation boats (positive). Each part was glass bead burnished to densify and coldwork the aluminum coating as follows: glass beads at approximately 40 psig in a standard sand blasting cabinet. One of the parts was labeled the control and the other three parts were labeled 1 thru 3.

Twenty-one inches for scribe marks extending thru the thickness of the aluminum coating and exposing the steel substrate were made in control.

A 0.1 molar solution of indium trichloride was produced and adjusted to a pH of about 2.0 with hydrochloric acid.

Sample 1, was immersed in the solution and held for 1 second. Then it was removed, rinsed, and dried. Sample 2 was immersed, held for 5 seconds, removed, rinsed and dried. Sample 3, was immersed, held for 15 seconds, removed, rinsed, and dried. Each of the three samples, like the control, was intentially damaged by scribe marks totalling 21 inches and deep enough to penetrate the coating and expose the steel substrate.

The control along with Samples 1 thru 3, were exposed to inland conditions for 13 months and the percentage of the 21 inches of scribe damage which showed red rusting of the steel was measured. The control showed 21 percent rusting, Sample 1 also showed 21 percent rusting, while Sample 2 showed 2 percent rusting and Sample 3 showed 7% rusting.

It was also observed that during immersion the indium deposited on the surface of the parts as metallic indium while no indium precipitated as indium hydroxide.

What is claimed is:

1. An improved method for inhibiting inland atmospheric corrosion of steel comprising;
   (a) coating a steel substrate with aluminum by ion vapor deposition;
   (b) glass bead burnishing the coated steel in order to consolidate and densify the aluminum coating;
   (c) immersing the burnished, coated steel in an aqueous solution of an effective amount of indium acid salt;
   (d) holding the steel in solution for sufficient time to permit surface deposition of small amounts of pure indium,
   (e) removing the steel from solution, rinsing, and drying
   whereby the indium is stabilized against premature precipitation and galvanically activates the aluminum coating against corrosion in mild or severe environments without the need for a solid solution of indium.

2. The method of claim 1 wherein the glass bead burnish is conducted under the conditions of 30-40 psi in a conventional abrasive blasting cabinet.

3. The method of claim 1 wherein the aluminum is pure aluminum.

4. The method of claim 1 wherein the aqueous solution of indium acid salt is from 0.08 to 0.25M at a pH of not more than 2.5.

5. The method of claim 1 wherein the acidified aqueous solution of indium salt is a solution of indium chloride.

6. The method of claim 5 wherein the solution is about 0.1M indium trichloride adjusted to a pH of about 2 with hydrochloric acid.

7. The method of claim 1 wherein the steel is held in the solution for less than 1 minute.

8. The method of claim 7 wherein the steel is in the solution for at least 5 seconds.

9. The method of claim 7 wherein the steel is held in the solution for 5 to 15 seconds.

* * * * *